(12) United States Patent
Kaufmann et al.

(10) Patent No.: US 8,901,923 B2
(45) Date of Patent: Dec. 2, 2014

(54) MAGNETIC FIELD SENSOR

(75) Inventors: Timo Kaufmann, Freiburg (DE);
Patrick Ruther, Karlsruhe (DE); Fabian Purkl, Palo Alto, CA (US); Olvier Paul, Au (DE)

(73) Assignees: Micronas GmbH, Freiburg (DE);
Albert-Ludwigs-Universitaet Freiburg, Freiburg (DE)

( * ) Notice: Subject to any disclaimer, the term of this patent is extended or adjusted under 35 U.S.C. 154(b) by 282 days.

(21) Appl. No.: 13/246,426

(22) Filed: Sep. 27, 2011

(65) Prior Publication Data

US 2012/0306485 A1    Dec. 6, 2012

Related U.S. Application Data

(60) Provisional application No. 61/493,251, filed on Jun. 3, 2011.

(51) Int. Cl.
*G01R 33/07*     (2006.01)
(52) U.S. Cl.
CPC ...................................... *G01R 33/07* (2013.01)
USPC .......................................................... 324/251
(58) Field of Classification Search
CPC ............................... G01R 33/07; G01R 33/077
USPC ....................................................... 324/251
See application file for complete search history.

(56) References Cited

U.S. PATENT DOCUMENTS

| 4,929,993 | A | 5/1990 | Popovic |
| 4,994,742 | A | 2/1991 | Lowther |
| 5,591,996 | A * | 1/1997 | Haigh et al. ................... 257/238 |
| 2004/0207031 | A1 * | 10/2004 | Berndt et al. .................. 257/414 |
| 2007/0290682 | A1 * | 12/2007 | Oohira et al. .................. 324/251 |
| 2009/0256559 | A1 | 10/2009 | Ausserlechner et al. |
| 2012/0200290 | A1 * | 8/2012 | Ausserlechner .............. 324/251 |
| 2013/0015853 | A1 * | 1/2013 | Raz et al. ...................... 324/251 |

FOREIGN PATENT DOCUMENTS

| CH | 33 05 43 A | 6/1958 |
| DE | 101 50 955 C1 | 6/2003 |
| DE | 10 2009 015 965 A1 | 10/2009 |
| GB | 797505 | 7/1958 |
| JP | 8-213669 | 8/1996 |

OTHER PUBLICATIONS

Banjevic et al., "On Performance of Series Connected CMOS Vertical Hall Devices," Proc 26$^{th}$ Int'l Conf. of Microelectronics (MEL 2008), pp. 337-340 (May 2008).
Lemme, Helmuth.: Punktgenau in drei Dimensionen messen; Elektronik 21/1999, pp. 106-112.

* cited by examiner

*Primary Examiner* — Patrick Assouad
*Assistant Examiner* — Hoang X Nguyen
(74) *Attorney, Agent, or Firm* — Muncy, Geissler, Olds & Lowe, P.C.

(57) ABSTRACT

A magnetic field sensor is provided, having a first Hall sensor with a first terminal contact and with a second terminal contact and with a third terminal contact and with a fourth terminal contact and with a fifth terminal contact, and a second Hall sensor with a sixth terminal contact and with a seventh terminal contact and with an eighth terminal contact and with a ninth terminal contact and with a tenth terminal contact, whereby the first terminal contact is connected to the fifth terminal contact and to the sixth terminal contact and to the tenth terminal contact, and the second terminal contact is connected to the ninth terminal contact, and the fourth terminal contact is connected to the seventh terminal contact.

11 Claims, 1 Drawing Sheet

MAGNETIC FIELD SENSOR

This nonprovisional application claims priority to U.S. Provisional Application No. 61/493,251, which was filed on Jun. 3, 2011, and is herein incorporated by reference.

BACKGROUND OF THE INVENTION

1. Field of the Invention

The invention relates to a magnetic field sensor.

2. Description of the Background Art

A magnetic field sensor is known from DE 101 50 955 C1. The magnetic field sensor has a plurality of vertical Hall sensors each with five terminal contacts. In this case, up to four Hall sensors are arranged parallel to one another and the terminal contacts are connected to one another by means of cyclic commutation, to reduce the offset of the magnetic field sensor in comparison with the offset of a single Hall sensor. In addition, the offset can be reduced further by means of the so-called "spinning current" method. It is desirable to improve the complex arrangement and the sensitivity of the magnetic field sensors.

SUMMARY OF THE INVENTION

It is therefore an object of an embodiment of the invention to provide a magnetic field sensor that has a first Hall sensor with a first terminal contact and with a second terminal contact and with a third terminal contact and with a fourth terminal contact and with a fifth terminal contact, and a second Hall sensor with a sixth terminal contact and with a seventh terminal contact and with an eighth terminal contact and with a ninth terminal contact and with a tenth terminal contact, whereby the first terminal contact is connected to the fifth terminal contact and to the sixth terminal contact and to the tenth terminal contact, and the second terminal contact is connected to the ninth terminal contact, and the fourth terminal contact is connected to the seventh terminal contact.

An advantage of the device of the invention is that it is possible to increase the sensitivity of the magnetic field sensor by means of the interconnection of the invention; i.e., the Hall voltage of the two connected Hall sensors is increased preferably by a factor of about 1.3 compared with the Hall voltage of a single sensor or the magnetic field sensor from DE 101 50 955 C1 at a given magnetic flux. It is understood that the Hall sensors of the magnetic field sensor have a current-carrying area, the normal vector of the area being arranged parallel to the direction of the magnetic field lines penetrating the area. Tests by the applicant have shown that with respect to the sensitivity an optimum arises with the inventive connection of precisely two Hall sensors.

In an embodiment, the third terminal contact and the eighth terminal contact are designed as a Hall voltage tap. In this regard, the sign of the Hall voltage to be measured depends on the direction of the current flow, the direction of the applied magnetic field, and the doping of the semiconductor regions in which the Hall sensors are designed. In another refinement, the second terminal contact and the fourth terminal contact are each designed as a supply voltage terminal. It is preferable in this case to connect the second or the fourth terminal contact to a reference potential and the respective other terminal contact to a supply voltage potential.

In an embodiment, the first Hall sensor can be arranged parallel to the second Hall sensor. In this case, the first Hall sensor and the second Hall sensor each have a longitudinal axis, whereby the longitudinal axis of the first Hall sensor is arranged parallel to the longitudinal axis of the second Hall sensor. According to a refinement, the first terminal contact up to and including the fifth terminal contact and the sixth terminal contact up to and including the tenth terminal contact are each arranged on a straight line. It is preferred in particular to design the first Hall sensor and the second Hall sensor as vertical Hall sensors.

Tests by the applicant have shown that it is practicable when the first Hall sensor and the second Hall sensor are arranged on a semiconductor body and an integrated circuit is formed on the semiconductor body. As a result, a control circuit, designed as part of the integrated circuit and having a functional connection with the magnetic field sensor, and an evaluation circuit can be monolithically integrated. It should be noted that the term functional connection is also understood, inter alia, to be an electrical connection between the integrated circuit and the magnetic field sensor. It is preferred furthermore to arrange the first Hall sensor and the second Hall sensor and the integrated circuit in a single common housing.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
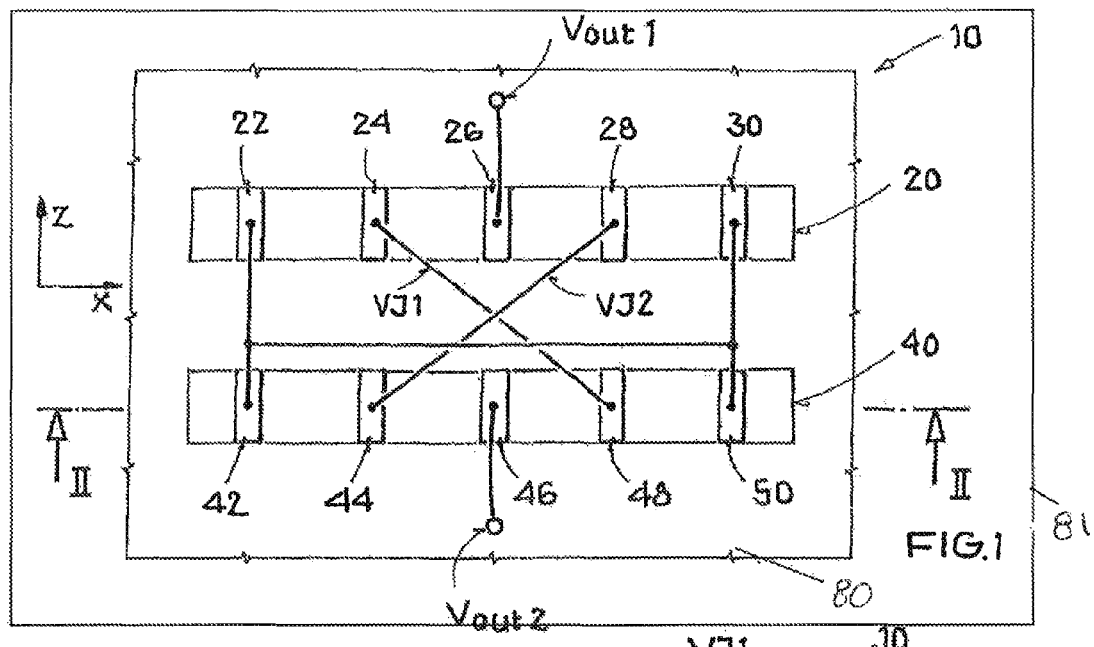
FIG. 1 shows a schematic plan view of an embodiment of the invention of a magnetic field sensor.

The illustration in FIG. 1 shows an embodiment of magnetic field sensor 10 of the invention, having a first preferably vertically designed Hall sensor 20, with a first terminal contact 22, a second terminal contact 24, a third terminal contact 26, a fourth terminal contact 28, and a fifth terminal contact 30, and a second preferably vertically designed Hall sensor 40, with a sixth terminal contact 42, a seventh terminal contact 44, an eighth terminal contact 46, a ninth terminal contact 48, and a tenth terminal contact 50. Furthermore, first terminal contact 22 is connected to fifth terminal contact 30 and to sixth terminal contact 42 and to tenth terminal contact 50, second terminal contact 24 is connected to ninth terminal contact 48, and fourth terminal contact 28 is connected to seventh terminal contact 44. Further, third terminal contact 26 and eighth terminal contact 46 are designed as Hall voltage taps, whereby the output voltage VOUT1 is present at third terminal contact 26 and the output voltage VOUT2 at eighth terminal contact 46. Further, second terminal contact 24 and fourth terminal contact 28 are each designed as a supply voltage terminal; here, the input voltage VI1 is present at terminal contact 24 and the input voltage VI2 at fourth terminal contact 28. It is understood that either the input voltage VI1 or the input voltage VI2 is connected to a reference potential, particularly to ground. The first Hall sensor 20 and the second Hall 40 sensor can be arranged on an integrated circuit 80 in a single common housing 81.

First Hall sensor 20 and second Hall sensor 40 are designed on a semiconductor substrate 60. First Hall sensor 20 and second Hall sensor 40 each have a longitudinal axis, and the longitudinal axes are arranged parallel to one another. In particular, first terminal contact 22 up to and including fifth terminal contact 30, and sixth terminal contact 42 up to and including tenth terminal contact 50 are each arranged on a straight line.

Figure 2:
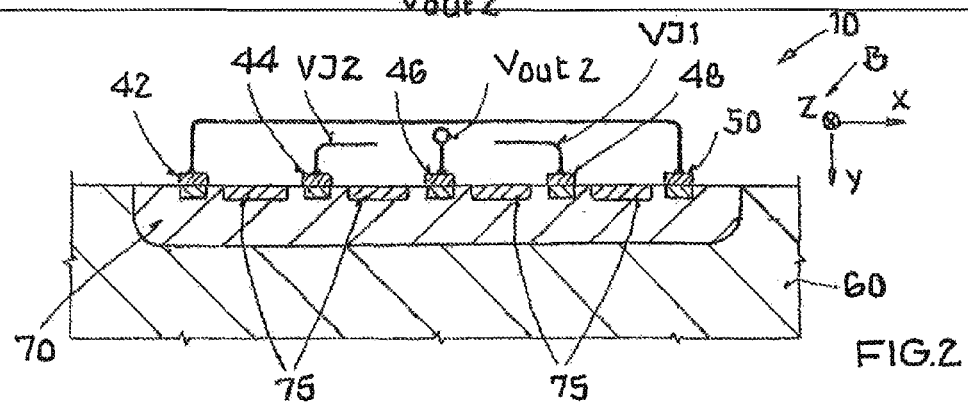
FIG. 2 shows a schematic cross section along a line II of the embodiment of FIG. 1.

FIG. 2 shows a cross section along a line II of the embodiment of FIG. 1 according to the invention. Only the differences from the embodiment depicted FIG. 1 will be explained below. Immediately below sixth terminal contact 42 up to and including tenth terminal contact 50, a heavily doped n-contact area is designed in each case, to connect the individual terminal contacts 42 to 50 in a low-impedance manner to a slightly doped n-well region 70. The n-well region 70 is formed within semiconductor body 60. An isolation region 75, preferably consisting of oxide or a p+ diffusion, is formed in each case between the individual n-contact regions. Semiconductor body 60 is preferably designed as a p-substrate. Preferably, the n-well region has phosphorus doping below 10e18 N/cm$^3$, whereas the n-contact region preferably has a doping above 10e18 N/cm$^3$. In contrast, the p-substrate has boron doping preferably below 10e17 N/cm$^3$.

According to the shown embodiment in FIG. 2, the direction of an applied magnetic field points in a z-direction, i.e., into the plane of the drawing. At a voltage difference, present between terminal contacts 24 and 28, between VI1 and VI2 of about 3 V, a sensitivity of magnetic field sensor 10 from up to 58 mV/T results in comparison with a sensitivity of up to 43 mV/T for a single vertical Hall sensor.

Figure 3A:
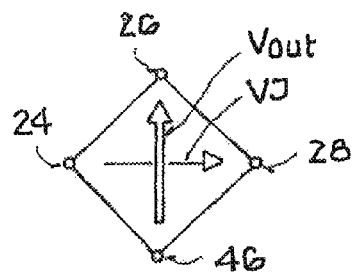
FIG. 3 shows a schematic illustration of the relationship between a Hall voltage and an applied supply voltage under the effect of an applied magnetic field for an n-doped magnetic field sensor.
Figure 3B:
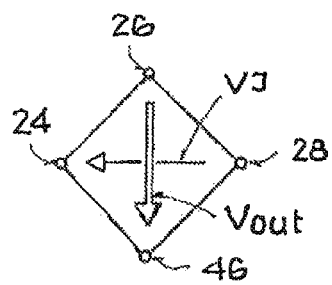

The relationship between the sign of an applied input voltage VI=VI1−VI2 and the output voltage VOUT=VOUT1−VOUT2 is shown in the illustration of FIG. 3a and FIG. 3b. If there is a higher voltage at second terminal contact 24 than at fourth terminal contact 28 in FIG. 3a, a negative output voltage VOUT arises accordingly between third terminal contact 26 and eighth terminal contact 46. In this case, the direction of the magnetic field corresponds to that shown in FIG. 2, whereby the sensors are n-doped, i.e., electron conductors. If according to FIG. 3b there is a higher voltage at fourth terminal contact 28 than at second terminal contact 24, a positive output voltage VOUT arises accordingly between third terminal contact 26 and eighth terminal contact 46.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic field sensor comprising:
   a first Hall sensor with a first terminal contact, a second terminal contact, a third terminal contact, a fourth terminal contact, and a fifth terminal contact;
   a second Hall sensor with a sixth terminal contact, a seventh terminal contact, an eighth terminal contact, a ninth terminal contact, and a tenth terminal contact;
   wherein the first terminal contact is physically connected to the fifth terminal contact, the sixth terminal contact and to the tenth terminal contact,
   wherein the second terminal contact is physically connected to the ninth terminal contact, and
   wherein the fourth terminal contact is physically connected to the seventh terminal contact.

2. The magnetic field sensor according to claim 1, wherein the third terminal contact and the eighth terminal contact are configured as Hall voltage taps.

3. The magnetic field sensor according to claim 1, wherein the second terminal contact and the fourth terminal contact are each supply voltage terminals.

4. The magnetic field sensor according to claim 1, wherein the first Hall sensor and the second Hall sensor each have a longitudinal axis and the longitudinal axes are arranged parallel to one another.

5. The magnetic field sensor according to claim 1, wherein the first terminal contact up to and including the fifth terminal contact and the sixth terminal contact up to and including the tenth terminal contact are each arranged on a straight line.

6. The magnetic field sensor according to claim 1, wherein the first Hall sensor and the second Hall sensor are vertical Hall sensors.

7. The magnetic field sensor according to claim 1, wherein the first Hall sensor and the second Hall sensor are arranged on a semiconductor body and an integrated circuit is formed on the semiconductor body.

8. The magnetic field sensor according to claim 7, wherein the first Hall sensor and the second Hall sensor and the integrated circuit are connected electrically and are arranged in a single common housing.

9. The magnetic field sensor according to claim 1, wherein the first terminal contact, the fifth terminal contact, the sixth terminal contact, and the tenth terminal contact are physically connected to each other by wiring.

10. The magnetic field sensor according to claim 1, wherein the second terminal contact and the ninth terminal contact are physically connected to each other by wiring.

11. The magnetic field sensor according to claim 1, wherein the fourth terminal contact and connected to the seventh terminal contact are physically connected to each other by wiring.

* * * * *